United States Patent [19]

Tamagawa et al.

[11] Patent Number: 5,089,370

[45] Date of Patent: * Feb. 18, 1992

[54] LIGHT-SENSITIVE MATERIAL COMPRISING LIGHT-SENSITIVE LAYER PROVIDED ON SUPPORT

[75] Inventors: Shigehisa Tamagawa, Shizuoka; Masayuki Kuroishi, Kanagawa, both of Japan

[73] Assignee: Fuji Photo Film Co., Ltd., Kanagawa, Japan

[*] Notice: The portion of the term of this patent subsequent to Oct. 24, 2006 has been disclaimed.

[21] Appl. No.: 641,612

[22] Filed: Jan. 16, 1991

Related U.S. Application Data

[63] Continuation of Ser. No. 207,974, Jun. 17, 1988, abandoned.

[30] Foreign Application Priority Data

Jun. 17, 1987 [JP] Japan .................. 62-150975

[51] Int. Cl.$^5$ .............................. G03C 1/72
[52] U.S. Cl. .................... 430/138; 430/203; 430/270; 430/538
[58] Field of Search ............ 430/138, 203, 270, 281, 430/538

[56] References Cited

U.S. PATENT DOCUMENTS

| | | | |
|---|---|---|---|
| 4,364,971 | 12/1982 | Sack et al. | 427/44 |
| 4,557,997 | 12/1985 | Iwasaki et al. | 430/325 |
| 4,584,267 | 4/1986 | Masukawa et al. | 430/619 |
| 4,629,676 | 12/1986 | Hayakawa et al. | 430/203 |
| 4,775,656 | 10/1988 | Harada et al. | 430/138 |
| 4,797,343 | 1/1989 | Nakamura | 430/138 |
| 4,803,148 | 2/1989 | Harada et al. | 430/138 |
| 4,814,252 | 3/1989 | Tamagawa et al. | 430/138 |
| 4,876,170 | 10/1989 | Tamagawa et al. | 430/138 |
| 4,883,738 | 11/1989 | Yamada | 430/138 |

FOREIGN PATENT DOCUMENTS

2177734 8/1988 United Kingdom .
2201007 8/1988 United Kingdom .

*Primary Examiner*—Hoa V. Le
*Attorney, Agent, or Firm*—Sughrue, Mion, Zinn, Macpeak & Seas

[57] ABSTRACT

A light-sensitive material comprises a light-sensitive layer containing silver halide, a reducing agent and an ethylenic unsaturated polymerizable compound provided on a paper support (the silver halide and polymerizable compound are contained in microcapsules which are dispersed in the light-sensitive layer). Another light-sensitive material comprises a light-sensitive layer containing a photo polymerizable composition or a photo polymerizable compound provided on a paper support (the photo polymerizable composition or photo polymerizable compound is contained in microcapsules which are dispersed in the light-sensitive layer). The paper support employs a base paper sheet having a void volume of not higher than 40%.

16 Claims, No Drawings

LIGHT-SENSITIVE MATERIAL COMPRISING LIGHT-SENSITIVE LAYER PROVIDED ON SUPPORT

This is a continuation of application Ser. No. 07/207,974, filed June 17, 1988, now abandoned.

FIELD OF THE INVENTION

The present invention relates to a light-sensitive material comprising a light-sensitive layer containing silver halide, a reducing agent and a polymerizable compound provided on a support. The invention also relates to a light-sensitive material comprising a light-sensitive layer containing a photo polymerizable composition or a photo polymerizable compound provided on a support.

BACKGROUND OF THE INVENTION

Light-sensitive materials comprising a light-sensitive layer containing silver halide, a reducing agent and a polymerizable compound provided on a support can be used in an image forming method in which a latent image of silver halide is formed, and then the polymerizable compound is polymerized to form the corresponding image.

Examples of the image forming methods are described in Japanese Patent Publications No. 45(1970)-11149 (corresponding to U.S. Pat. No. 3,697,275), No. 47(1972)-20741 (corresponding to U.S. Pat. No. 3,687,667) and No. 49(1974)-10697, and Japanese Patent Provisional Publications No. 57(1982)-138632, No. 57(1982)-142638, No. 57(1982)-176033, No. 57(1982)-211146 (corresponding to U.S. Pat. No. 4,557,997), No. 58(1983)-107529 (corresponding to U.S. Pat. No. 4,560,637), No. 58(1983)-121031 (corresponding to U.S. Pat. No. 4,547,450) and No. 58(1983)-169143. In these image forming methods, when the exposed silver halide is developed using a developing solution, the polymerizable compound is induced to polymerize in the presence of a reducing agent (which is oxidized) to form a polymer image. Thus, these methods need a wet development process employing a developing solution. Therefore the process takes a relatively long time for the operation.

An improved image forming method employing a dry process is described in Japanese Patent Provisional Publications No. 61(1986)-69062 and No. 61(1986)-73145 (the contents of both publications are described in U.S. Pat. No. 4,629,676 and European Patent Provisional Publication No. 0174634A2). In this image forming method, a recording material (i.e., light-sensitive material) comprising a light-sensitive layer containing a light-sensitive silver salt (i.e., silver halide), a reducing agent, a cross-linkable compound (i.e., polymerizable compound) and a binder provided on a support is imagewise exposed to light so as to form a latent image, and then the material is heated to form a polymer within the area where the latent image of the silver halide has been formed. The above method employing the dry process and the light-sensitive material employable for such method are also described in Japanese Patent Provisional Publications No. 61(1986)-183640, No. 61(1986)-188535, No. 61(1986)-228441 and No. 61(1986)-278849.

The above-mentioned image forming methods are based on the principle in which the polymerizable compound is polymerized within the area where a latent image of the silver halide has been formed.

Japanese Patent Provisional Publication No. 61(1986)-260241 described another image forming method in which the polymerizable compound within the area where a latent image of the silver halide has not been formed is polymerized. In this method, when the material is heated, the reducing agent functions as polymerization inhibitor within the area where a latent image of the silver halide has been formed, and the polymerizable compound within the other area is polymerized.

Another light-sensitive material comprising a light-sensitive layer containing a photo polymerizable composition or a photo polymerizable compound provided on a support is employed for an image-forming method, which comprises imagewise exposing the light-sensitive material to form a polymer within the exposed area. The light-sensitive material and the image-forming method are described in Japanese Patent Provisional Publications No. 57(1982)-179836, No. 58(1983)-88739, No. 58(1983)-88740 (corresponding to U.S. Pat. No. 4,440,846) and No. 60(1985)-259490 (corresponding to U.S. Pat. No. 4,554,235).

Further, Japanese Patent Provisional Publications No. 61(1986)-73145, No. 58(1983)-88739 (corresponding to U.S. Pat. No. 4,399,209), No. 58(1983)-88740 and No. 60(1980)-259490 describe embodiments of the above-stated image-forming method, which comprise imagewise forming a polymer on the light-sensitive material, and pressing the light-sensitive material on an image-receiving material to transfer unpolymerized polymerizable compound (the term of "polymerizable compound" hereinafter sometimes includes the photo polymerizable composition and photo polymerizable compound) to the image-receiving material. In the image-forming method including the image transfer process, the components of the light-sensitive layer, such as silver halide, reducing agent and polymerizable compound are preferably contained in microcapsules which are dispersed in the light-sensitive layer.

As the support for the light-sensitive material, a paper is sometimes employed, because a paper is disposable, lightweight and easy to handle.

SUMMARY OF THE INVENTION

According to study of the present inventors, a paper support sometimes shows certain unfavorable behavior in the above-stated image-forming method. In more detail, in the case that the unpolymerized polymerizable compound is transferred from the light-sensitive material employing a paper support to the image-receiving material, low optical density spots containing only an extremely small amount of the polymerizable compound are sometimes formed on the image-receiving material within the area where a sufficient amount of the polymerizable compound should be trransferred. For example, the low optical density spots having a relatively large diameter of not less than 1 mm are sometimes observed when the image is transferred from a light-sensitive material employing microcapsules to an image-receiving material.

An object of the present invention is to provide a light-sensitive material employing a paper support which is minimized or reduced in occurrence of the low optical density spots in the image formation.

There is provided by the present invention a light-sensitive material comprising a light-sensitive layer containing silver halide, a reducing agent and an ethylenic unsaturated polymerizable compound provided on a paper support (the silver halide and polymerizable compound are contained in microcapsules which are dispersed in the light-sensitive layer), wherein the paper support employs a base paper sheet having a void volume of not higher than 40%.

There is also provided by the invention a light-sensitive material comprising a light-sensitive layer containing a photo polymerizable composition or a photo polymerizable compound provided on a paper support (the photo polymerizable composition or photo polymerizable compound is contained in microcapsules which are dispersed in the light-sensitive layer), wherein the paper support employs a base paper sheet having a void volume of not higher than 40%.

The light-sensitive material of the present invention is characterized in that the paper support employs a base paper sheet having a low void volume of not higher than 40%.

The present inventors have found that at least one cause of the production of the low optical density spots is attributed to the effect that the paper support is not sufficiently hard to assist rupture of the microcapsules. In the image forming process employing a light-sensitive material wherein the silver halide and polymerizable compound are contained in microcapsules, or a light-sensitive material wherein the photo polymerizable composition or photo polymerizable compound is contained in microcapsules, unhardened microcapsules, in which the polymerizable compound is unpolymerized, are ruptured under pressure applied to transfer the unpolymerized polymerizable compound to the image-receiving material. When the hardness of the support of the light-sensitive material is insufficient, the microcapsules are not uniformly ruptured and as a result, the above-mentioned low optical density spots are produced.

In the light-sensitive material of the present invention, a base paper sheet having a low void volume, that is, a stiff paper is used for the paper support so that the unhardened microcapsules can be uniformly ruptured in the image forming process. Accordingly, unevenness in the rupture of the unhardened microcapsules is scarcely caused. Therefore, the light-sensitive material of the present invention gives a clear transferred image in which the occurrence of the low optical density spots in the image formation are minimized or reduced.

DETAILED DESCRIPTION OF THE INVENTION

The light-sensitive material of the present invention utilizes a paper support. The term "paper support" in the invention refers to a base paper sheet essentially composed of wood pulp (hereinafter referred to as "base paper") or to a sheet comprising a coating layer provided on the base paper sheet.

The base paper sheet for the paper support of the light-sensitive material of the present invention has a void volume of 40% or lower. In the present specification, the void volume is defined as a value which is measured by the method for measuring the specific gravity of solid according to JIS-Z-8807. The base paper sheet preferably has a void volume of 20 to 40%.

The void volume of the base paper sheet can be measured in the following manner.

The specific gravity (true density; $D_o$) of paper is measured according to the measuring method using a specific gravity bottle, which is described in the method (2) for measuring the specific gravity of solid specified in JIS-Z-8807. In this measuring method using a specific gravity bottle, the mass of a liquid ($m_1 = M_2 - M_1$) is calculated from $M_1$ and $M_2$, wherein $M_1$ is the mass of a specific gravity bottle containing a sample and $M_2$ is the mass of the specific gravity bottle filled with the liquid in addition to the sample. Subsequently, the mass of the liquid having a volume equal to that of the sample ($m_0 = m_2 - m_1$) is calculated from $m_1$ and $m_2$, wherein $m_2$ is the mass of the liquid alone with which the specific gravity bottle is filled. The specific gravity ($D_0 = m/m_0$) is then calculated from m and $m_0$, wherein m is the mass of the sample.

The density (apparent density: D) of paper is calculated from the basis weight (W) of paper and the thickness (T) of paper according to JIS-P-8118 which is described in more detail hereinafter. The void volume of paper is calculated from $D_O$ and D by the following formula:

$$\text{Void Volume (\%)} = \left(1 - \frac{D}{D_0}\right) \times 100$$

The void volume is described in more detail in the literature "Type of Paper Pulp and Testing Method therefor" pp. 313-314 (written in Japanese, published by the Society for Paper Pulp Technology).

The base paper sheet preferably has a density of not higher than 1.2 g/cm³. In the present specification, the density is defined as a value measured according to JIS-P-8118. When the base paper sheet has a density of higher than 1.2 g/cm³, the paper is liable to be caused to swell and wrinkle during the process for preparation of the paper, particularly at a winding stage. As a result, unevenness in coating or coating lines may be caused when the light-sensitive layer is coated on the base paper sheet has a density of higher than 1.2 g/cm³ at a subsequent stage.

The density is measured according to JIS-P-8118 (Testing method for thickness and Density of Paper and Paperboard) in the following manner.

The paper to be tested is placed upon the lower disk of the micrometer, and its plunger is raised until the lower end thereof reaches to the position approximately 0.6 mm apart from the surface of the paper, and is released at this position. The density (D) of paper is calculated from the measured thickness (T) of paper and the basis weight (W) of paper by the following formula:

$$D(\text{g/cm}^3) = \frac{W(\text{g/m}^2)}{T(\text{mm}) \times 1,000}$$

The base paper sheet more preferably has a density of 0.8 to 1.2 g/cm³, and most preferably has a density of 0.9 to 1.1 g/cm³.

The constitution of the paper support used in the present invention and means of providing a base paper sheet having a low void volume are described below.

The base paper sheet used for the paper support is mainly composed of a wood pulp. There is no specific limitation with respect to the wood pulp. Examples of the wood pulps include laubholz bleached kraft pulp (LBKP), nadelholz bleached kraft pulp (NBKP), laubholz bleached sulfite pulp (LBSP), nadelholz bleached sulfite pulp (NBSP), laubholz dissolving pulp (LDP), nadelholz dissolving pulp (NDP), laubholz unbleached kraft pulp (LUKP) and nadelholz unbleached kraft pulp (NUKP). LBKP, LBSP, NBSP, LDP and NDP are preferred, because they are mainly composed of short fibers.

According to the present invention, the base paper sheet contains at least one pulp selected from the group consisting of a laubholz bleached sulfite pulp (LBSP) and a laubholz dissolving pulp (LDP) in an amount of 5 to 60 weight % based on the total amount of pulp contained in the base paper sheet.

The wood pulp can be partially replaced with a plant fiber pulp such as straw, esparto, bagasse, kenaf or the like; a synthetic pulp composed of polyethylene, polypropylene or the like; or a synthetic fiber composed of a polyester, polyvinyl alcohol, nylon or the like.

The wood pulp is preferably beaten to have a Canadian standard freeness (CSF) as a whole in the range of from 200 to 400 cc, and more preferably from 250 to 350 cc.

A filler (e.g., calcium carbonate, talc, clay, kaolin, titanium dioxide and fine particles of urea resin), an internal size (e.g., rosin, paraffin wax, a salt of higher fatty acid, a salt of an alkenylsuccinic acid, a fatty acid anhydride and an alkylketene dimer), a paper strengthening agent (e.g., polyacrylamide, starch, polyvinyl alcohol and melamine-formaldehyde condensate), a softening agent (e.g., a reaction product of a maleic anhydride copolymer with a polyalkylene polyamine and a quarternary ammonium salt of a higher fatty acid), a fixing agent (e.g., alminium sulfate, a colored dye and/or a fluorescent dye can be added to the base paper sheet.

The base paper sheet can be prepared by Fourdrinier paper machine or Cylinder paper machine. The base paper sheet preferably has a basis weight of 20 g/m$^2$ to 200 g/m$^2$, and more preferably 30 g/m$^2$ to 100 g/m$^2$. The thickness of the base paper sheet preferably ranges from 25 to 250 μm, and more preferably from 40 to 150 μm.

The base paper sheet is preferably passed through a calender such as on-machine calender in a paper machine or supercalender outside a paper machine to lower the void volume. The base paper sheet is more preferably passed through an on-machine calender. The base paper sheet is calendered preferably at a linear pressure in the range of 150 to 300 kgf/cm. Further, the base paper sheet is calendered preferably at a temperature in the range of 50° to 90° C.

The void volume of the base paper sheet can be adjusted to not more than 40% using various means in the course of the above-stated process such as calendering.

The base paper sheet itself can be used as a paper support of the light-sensitive material of the invention. However, a coating layer containing a hydrophobic polymer is preferably provided on a side or both sides of the base paper sheet. The coating layer can comprise two or more layers, so long as at least one layer contains a hydrophobic polymer.

A conventional surface size can be coated on the surface of the base paper sheet prior to providing a coating layer on the base paper sheet. Examples of the surface size include polyvinyl alcohol, starch, polyacrylamide, gelatin, casein, styrene-maleic anhydride copolymer, alkylketene dimer, polyurethane and an epoxidized fatty acid amide.

The hydrophobic polymer contained in the coating layer preferably is a polymer having a glass transition point in the range of −20° to 50° C. The polymer can be a homopolymer or a copolymer. The copolymer may partially contain a hydrophilic repeating unit, so long as it is hydrophobic as a whole. Examples of the hydrophobic polymers include polyvinylidene chloride, styrene-butadiene copolymer, methyl methacrylate-butadiene copolymer, acrylonitrile-butadiene copolymer, styrene-acrylate copolymer, methyl methacrylate-acrylate copolymer and styrene-methacrylate-acrylate copolymer.

The hydrophobic polymer preferably has a cross-linked structure. The cross-linked structure can be introduced into the hydrophobic polymer when a conventional hardening agent (crosslinking agent) is used together with the hydrophobic polymer in the course of the preparation of the paper support. Examples of the hardening agents include an active vinyl compound (e.g., 1,3-bis(vinylsulfonyl)-2-propanol, methylenebismale-imide), an active halogen compound (e.g., sodium salt of 2,4-dichloro-6-hydroxy-S-triazine, 2,4-dichloro-6-hydroxy-S-triazine, N,N'-bis(2-chloroethylcarbamyl)-piperazine), an epoxy compound (e.g., bis(2,3-epoxypropyl)methylpropylammonium p-toluenesulfonate), and a methanesulfonate compound (e.g., 1,2-di(methane-sulfonoxy)ethane).

A pigment can be added to the coating layer to increase the smoothness of the surface of the coating layer and to facilitate the formation of the coating layer in the course of preparation. The pigment may be any of inorganic and organic pigments employed in the conventional coated paper (coated paper, art paper, baryta paper etc.). Examples of the inorganic pigments include titanium dioxide, barium sulfate, talc, clay, kaolin, calcined kaolin, aluminum hydroxide, amorphous silica and crystalline silica. Examples of the organic pigments include polystyrene resin, acrylic resin, urea-formaldehyde resin.

A waterproofing agent can be added to the coating layer containing a hydrophobic polymer. Examples of the waterproofing agents include polyamidepolyamine-epichlorohydrin resin, melamine-formaldehyde resin, urea-formaldehyde resin, polyamide-polyurea resin, glyoxal resin. Resins containing no formaldehyde (e.g., polyamide-polyamine-epichlorohydrin resin and polyamide-polyurea resin) are particularly preferred.

The coating layer can be prepared by coating a latex of the hydrophobic polymer on the surface of the base paper sheet. The other components such as the hardening agent, pigment, waterproofing agent can be previously dissolved or dispersed in the latex of the hydrophobic polymer. The latex can be coated on the base paper sheet according to any of conventional coating methods such as dip coating method, air-knife coating method, curtain coating method, roller coating method, doctor coating method, gravure coating method.

The coating layer containing the hydrophobic polymer is preferably provided on the base paper sheet in a coating weight of not less than 3 g/m$^2$ (total amount in the case that two or more layers are provided), and more preferably 5 to 30 g/m$^2$.

The paper support can be passed through a calender such as gloss calender or supercalender to improve the smoothness of the paper support simultaneously with or after coating the layer on the base paper sheet.

In the light-sensitive material of the invention, a light-sensitive layer is provided on the above-mentioned paper support. In an embodiment, the light-sensitive layer contains at least silver halide, a reducing agent and an ethylenic unsaturated polymerizable compound. In another embodiment, the light-sensitive layer contains at least a photo polymerizable composition or a photo polymerizable compound. Each of the components of the light-sensitive layer is described below.

There is no specific limitation with respect to silver halide contained in the light-sensitive layer of the light-sensitive material. Examples of the silver halides include silver chloride, silver bromide, silver iodide, silver chlorobromide, silver chloroiodide, silver iodobromide, and silver chloroiodobromide in the form of grains.

The halogen composition of individual grains may be homogeneous or heterogeneous. The heterogeneous grains having a multilayered structure in which the halogen composition varies from the core to the outer shell (see Japanese Patent Provisional Publication Nos. 57(1982)-154232, 58(1983)-108533, 59(1984)-48755 and 59(1984)-52237, U.S. Pat. No. 4,433,048, and European Patent No. 100,984) can be employed. A silver halide grain having a core/shell structure in which the silver iodide content in the shell is higher than that in the core can be also employed.

There is no specific limitation on the crystal habit of silver halide grains. For example, a tubular grain having an aspect ratio of not less than 3 can be used.

The silver halide grains preferably have such a relatively low tendency to be fogged that the amount of developed silver is not more than 5 weight % based on the total amount of silver when the unexposed silver halide grains are developed in 1 l of an aqueous developing solution containing 1.0 g of metol, 15.0 g of sodium sulfite, 4.0 g of hydroquinone, 26.7 g of sodium carbonate monohydrate and 0.7 g of potassium bromide.

Two or more kinds of silver halide grains which differ in halogen composition, crystal habit, grain size, and/or other features from each other can be used in combination.

There is no specific limitation on grain size distribution of silver halide grains. For example, the silver halide grains having such a grain size distribution that the coefficient of the variation is not more than 20% can be employed.

The silver halide grains ordinarily have a mean size of 0.001 to 5 $\mu$m, more preferably 0.001 to 2 $\mu$m, more preferably 0.001 to 2 $\mu$m.

The total silver content (including silver halide and an organic silver salt which is one of optional components) in the light-sensitive layer preferably is in the range of from 0.1 mg/m$^2$ to 10 g/m$^2$. The silver content of the silver halide in the light-sensitive layer preferably is not more than 0.1 g/m$^2$, more preferably in the range of from 1 mg to 90 mg/m$^2$.

The reducing agent employed in the light-sensitive material has a function of reducing the silver halide and/or a function of accelerating or restraining a polymerization of the polymerizable compound. Examples of the reducing agents having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, $\alpha$-sulfonamidoketones, hydrazines, etc. Depending on the nature or amount of the reducing agent, the polymerizable compound within either the area where a latent image of the silver halide has been formed or the area where a latent image of the silver halide has not been formed can be polymerized. In the developing system in which the polymerizable compound within the area where the latent image has not been formed is polymerized, 1-phenyl-3-pyrazolidone is preferably employed as the reducing agent.

The light-sensitive materials employing the reducing agent having these functions (including compounds referred to as developing agent, hydrazine derivative or precursor of reducing agent) are described in Japanese Patent Provisional Publication Nos. 61(1986)-183640, 61(1986)-188535 and 61(1986)-228441. These reducing agents are also described in T. James, "The Theory of the Photographic Process", 4th edition, pp. 291-334 (1977), Research Disclosure No. 17029, pp. 9-15 (June 1978), and Research Disclosure No. 17643, pp. 22-31 (December 1978). The reducing agents described in the these publications can be employed in the light-sensitive material of the present invention. Thus, "the reducing agent(s)" in the present specification means to include all of the reducing agents described in the above mentioned publications and applications.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Examples of these reducing agents include pentadecylhydroquinone, 5-t-butylcatechol, p-(N,N-diethylamino)phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N-methyl-N-octadecylcarbamoyl)-4-sulfonylaminonaphthol, 1-acetyl-2-phenylhydrazine, 1-acetyl-2-(p- or o-aminophenyl)hydrazine, 1-formyl-2-(p- or o-methoxyphenyl)hydrazine, 1-acetyl-2-(p- or o-methoxyphenyl)hydrazine, 1-lauroyl-2-(p- or o-aminophenyl)hydrazine, 1-trityl-2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)-butyloyl}-2-(p- or o-aminophenyl)hydrazine, 1-{2-(2,5-di-t-pentylphenoxy)butyloyl}-2-(p- or o-aminophenyl)hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]hydrazine, 1-{4-(2,5-di-tert-pentylphenoxy)butyloyl}-2-(p- or o-methoxyphenyl)hydrazine, 1-(methoxycarbonylbenzohydryl)-2-phenylhydrazine, 1-formyl-2-[4-{2-(2,4-di-tert-pentylphenoxy)-butylamide}phenyl]hydrazine, 1-acetyl-2-[4-{2-(2,4-di-tert-pentylphenoxy)butylamido}phenyl]hydrazine, 1-trityl-2-[{2,6-dichloro-4-(N,N-di-2-ethylhexyl)carbamoyl}phenyl]hydrazine, 1-(methoxycarbonylbenzohydryl)-2-(2,4-dichlorophenyl)hydrazine, 1-trityl-2-[{2-(N-ethyl-N-octylsulfamoyl)-4-methanesulfonyl}phenyl]hydrazine, 1-benzoyl-2-tritylhydrazine, 1-(4-butoxybenzoyl)-2-tritylhydrazine, 1-(2,4-dimethoxybenzoyl)-2-tritylhydrazine, 1-(4-dibutylcarbamoylbenzoyl)-2-tritylhydrazine and 1-(1-naphthoyl)-2-tritylhydrazine.

The amount of the reducing agent in the light-sensitive layer preferably ranges from 0.1 to 1,500 mole % based on the amount of silver (contained in the above-mentioned silver halide and an organic silver salt).

There is no specific limitation with respect to the polymerizable compound, except that the compound has an ethylenic unsaturated group. Any known ethylenic unsaturated polymerizable compounds (including monomers, oligomers and polymers) can be contained in the light-sensitive layer. In the image-forming method of the invention, a polymerizable compounds having a relatively higher boiling point (e.g., 80° C. or higher) is prebarably employed because it is hardly evaporated upon heating. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds. Further, in the case that a transferred image is formed on an image-receiving material, the polymerizable compound preferably has a viscosity of not lower than 100 cP at 25° C.

Examples of compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic esters, itaconic esters, styrene, styrene derivatives, vinyl ethers, vinyl esters, N-vinyl heterocyclic compounds, allyl ethers, allyl esters, and compounds carrying a group or groups corresponding to one or more of these compounds.

Concrete examples of the acrylic esters include n-butyl acrylate, cyclohexyl acrylate, 2-ethylhexyl acrylate, benzyl acrylate, furfuryl acrylate, ethoxyethoxyethyl acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. For example, a mixture of two or more polymerizable compounds can be employed. Further, compounds formed by bonding a polymerizable group such as a vinyl group or a vinylidene group to a reducing agent or a color image forming substance are also employed as the polymerizable compounds. The light-sensitive materials employing these compounds which show functions as both the reducing agent and the polymerizable compound, or of the color image forming substance and the polymerizable compound are included in embodiments of the invention.

The amount of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the silver halide.

A light-sensitive layer containing a photo polymerizable composition can be used instead of the light-sensitive layer containing silver halide, a reducing agent and polymerizable compound.

In the present invention, the photo polymerizable composition comprises a mixture of a photo polymerization initiator and a polymerizable compound. The polymerizable compound employable for the photo polymerizable composition is the same as the above-stated polymerizable compound.

Examples of the photo polymerization initiator include α-alkoxyphenylketones, polycyclic quinones, benzophenones, substituted benzophenones, xanthones, thioxanthones, halide compounds (e.g., chlorosulfonyl polynuclear aromatic compounds, chloromethyl polynuclear aromatic compounds, chlorosulfonylbenzophenones, chloromethylbenzophenones, fluorenones), haloalkanes, α-halo-α-phenylacetophenones, redox couples of photo reducible dye and reducing agent, paraffin halide (e.g., brominated paraffin, chlorinated paraffin), benzoyl alkyl ethers and lophine dimer-mercapto compound couples. Among them, aromatic ketones are preferred.

Concrete examples of the photo polymerization initiator include 2,2-dimethoxy-2-phenylacetophenone, 9,10-anthraquinone, benzophenone, Michler's ketone, 4,4'-diethylaminobenzophenone, xanthone, chloroxanthone, thioxanthone, chlorothioxanthone, 2,4-diethylthioxanthone, chlorosulfonylxanthone, chlorosulfonylanthraquinone, chloromethylanthracene, chloromethylbenzothiazole, chlorosulfonylbenzoxazole, chloromethylquinoline, chloromethylbenzophenone, chlorosulfonylbenzophenone, fluorenone, carbon tetrabromide, benzoin butyl ether, benzoin isopropyl ether, a combination of 2,2'-bis(o-chlorophenyl)-4,4',5,5'-tetraphenylbiimidazole and 2-mercapto-5-methylthio-1,3,4-thiadiazole.

The photo polymerization initiator can be used singly or in combination of two or more compounds.

The photo polymerization initiator is preferably used in amount of 0.5 to 30 weight %, more preferably 2 to 20 weight %, based on the amount of the polymerizable compound.

Instead of the photo polymerizable composition, a photo polymerizable compound which itself has a photo polymerization property can be used.

Examples of the photo polymerizable compound include acrylamide, barium acrylate, glycerol triacrylate, N,N'-methylene bisacrylamide, polyethylene glycol diacrylate, pentaerythritol diacrylate, pentaerythritol triacrylate, vinylcarbazole and silicate ester of polyvinyl alcohol. A compound synthesized by introducing a light-sensitive group into the above-mentioned polymerizable compound can be also used as a photo polymerizable compound.

Various embodiments of the light-sensitive materials, optional components which may be contained in the light-sensitive layer, and auxiliary layers which may be optionally arranged on the light-sensitive materials are described below.

In the case that the light-sensitive layer contains silver halide, a reducing agent and a polymerizable compound, the silver halide and polymerizable compound are contained in micocapsules which are dispersed in the light-sensitive layer. In the case that the light-sensitive layer contains a photo polymerizable composition or a photo polymerizable compound, the photo polymerizable composition or compound is contained in microcapsules which are dispersed in the light-sensitive layer. Other components in the light-sensitive layer, such as the reducing agent, the color image forming substances may be also contained in the microcapsules.

In the case that silver halide grains are contained in the microcapsules, microcapsules containing five or more silver halide grains are preferably present in an amount of more than 50% by weight based on the total amount of the microcapsules.

There is also no specific limitation on shell material of the microcapsule, and various known materials such as polymers which are employed in the conventional microcapsules can be employed as the shell material. Examples of the shell material include polyamide resin and/or polyester resin, polyurea resin and/or polyurethane resin, aminoaldehide resin, gelatin, epoxy resin, a complex resin containing polyamide resin and polyurea resin, a complex resin containing polyurethane resin and polyester resin.

The mean size of the microcapsule preferably ranges from 0.5 to 50 $\mu$m, more preferably 1 to 25 $\mu$m, most preferably 3 to 20 $\mu$m.

In the case that silver halide is contained in the microcapsule, at least 70 weight % of the silver halide is preferably arranged in the shell material of the microcapsules, and more preferably at least 90 weight %.

Further, two or more kinds of the microcapsules differing from each other with respect to at least one of the silver halide, polymerizable compound and color image forming substance can be employed. Furthermore, three or more kinds of the microcapsules differing from each other with respect to the color image forming substance is preferably employed to form a full color image.

The light-sensitive layer can further contain optional components such as color image forming substances, sensitizing dyes, organic silver salts, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, matting agents, antismudging agents, plasticizers, water releasers, binders, photo polymerization initiator and solvent of the polymerizable compound.

The light-sensitive material containing the above-mentioned components can give a polymer image. When the light-sensitive material further contains a color image forming substance as an optional component, the material can give a color image.

There is no specific limitation with respect to the color image forming substance, and various kinds of substances can be employed. Thus, examples of the color image forming substance include both colored substance (i.e., dyes and pigments) and non-colored or almost non-colored substance (i.e., color former or dye- or pigment-precursor) which develops to give a color under application of external energy (e.g., heating, pressing, light irradiation, etc.) or by contact with other components (i.e., developer). The light-sensitive material using the color image forming substance is described in Japanese Patent Provisional Publication No. 61(1986)-73145 (corresponding to U.S. Pat. No. 4,629,676 and European Patent Provisional Publication No. 0174634A2).

Examples of the dyes and pigments (i.e., colored substances) employable in the invention include commercially available ones, as well as various known compounds described in the technical publications, e.g., Yuki Gosei Kagaku Kyokai (ed.), Handbook of Dyes (in Japanese, 1970) and Nippon Ganryo Gijutsu Kyokai (ed.), New Handbook of Pigments (in Japanese, 1977). These dyes and pigments can be used in the form of a solution or a dispersion.

Examples of the substances which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two or more components, such as acid-base reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), pp. 29–58 (pressure-sensitive copying paper), pp. 87–95 (azo-graphy), pp. 118–120 (heat-sensitive color formation by a chemical change) or in MSS. of the seminer promoted by the Society of Kinki Chemical Industry, "The Newest Chemistry of Coloring Matter-Attractive Application and New Development as a Functional Coloring Matter", pp. 26–32 (June, 19, 1980).

In the case that the color image forming substance comprises two components (e.g., color former and a developer), one component and the polymerizable compound is contained in the microcapsule, and the other component is arranged outside of the microcapsule in the light-sensitive layer, a color image can be formed on the light-sensitive layer.

The color image forming substance in the light-sensitive material is preferably used in an amount of from 0.5 to 50 parts by weight, and more preferably from 2 to 30 parts by weight, per 100 parts by weight of the polymerizable compound. In the case that the developer is used, it is preferably used in an amount of from about 0.3 to about 80 parts by weight per one part by weight of the color former.

There is no specific limitation with respect to the sensitizing dyes, and known sensitizing dyes used in the conventional art of photography may be employed in the light-sensitive material. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from about $10^{-8}$ to about $10^{-2}$ mol per 1 mol of silver halide. The sensitizing dye is preferably added during the stage of the preparation of the silver halide emulsion (simultaneously with or after the grain formation).

In the heat-development process, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an α-hydrogen atom, imino group-containing compounds, and the like. Among them, benzotriazoles are most preferable. The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzotriazole) which can form an organic silver salt in combination with an inorganic silver salt can be added to the light-sensitive layer to obtain the same effect.

Various image formation accelerators are employable in the light-sensitive material. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into inorganic bases, organic bases, base precursors, oils, surface active agents, compounds functioning as an anti-fogging agent and/or a development accelerator, hot-melt solvents, antioxidants and the like. These groups, however, generally have certain combined functions, i.e., two or more of the above-mentioned effects. Thus, the above classification is for the sake of convenience, and one compound often has a plurality of functions combined.

Various examples of these image formation accelerators are shown below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkyl-substituted aromatic amines and bis[p-(dialkylamino)phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Preferred examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate, and 4-acetylaminomethyl propionate.

These bases or base precursors are preferably used in an amount of not more than 100% by weight, and more preferably from 0.1 to 40% by weight, based on the total solid content of the light-sensitive layer. These bases or base precursors can be used singly or in combination.

In the light-sensitive material, the silver halide, reducing agent and polymerizable compound are preferably contained in a microcapsule and the base or base precursor is preferably arranged outside of the microcapsule in the light-sensitive layer. Further, the base or base precursor can be contained in a different microcapsule from that containing the polymerizable compound. The base or base precursor can be contained in the microcapsule under condition that the base or base precursor is dissolved or dispersed in an aqueous solution of a water retention agent, orr under condition that the base or base precursor is adsorbed on solid particles. Furthermore, the base or base precursor can be contained in a layer different from the light-sensitive layer.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The compounds functioning as an antifogging agent and/or a development accelerator are used to give a clear image having a high maximum density and a low minimum density (an image having high contrast). Examples of the compounds include a 5- or 6-membered nitrogen containing heterocyclic compound (e.g., a cyclic amide compound), a thiourea derivative, a thioether compound, a polyethylene glycol derivative, a thiol derivative, an acetylene compound and a sulfonamide derivative.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having $-SO_2-$ and/or $-CO-$ group described in U.S. Pat. No. 3,347,675; polar compounds described in U.S. Pat. No. 3,667,959; and 1,10-decanediol, methyl anisate and biphenyl suberate described in Research Disclosure 26-28 (December 1976). The hot-melt solvent is preferably used in an amount of from 0.5 to 50% by weight, and more preferably from 1 to 20% by weight, based on the total solid content of the light-sensitive layer.

The antioxidants can be used to eliminate the influence of the oxygen which has an effect of inhibiting polymerization in the development process. Example of the antioxidants is a compound having two or more mercapto groups.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", pp. 6-18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis-(1-cyclohexanecarbonitrile), dimethyl 2,2'-azobisiso-butyrate, 2,2'-azobis(2-methylbutyronitrile), and azobisdimethylvaleronitrile; organic peroxides, e.g., benzoyl peroxide, di-tert-butyl peroxide, dicumyl peroxide, tert-butyl hydroperoxide, and cumene hydroperoxide; inorganic peroxides, e.g., hydrogen peroxide, potassium persulfate, and ammonium persulfate; and sodium p-toluenesulfinate. The thermal polymerization initiators are preferably used in an amount of from 0.1 to 120% by weight, and more preferably from 1 to 10% by weight, based on amount of the polymerizable compound. In a system in which the polymerizable compound within the area where the latent image has not been formed is polymerized, the thermal polymerization initiators are preferably incorporated into the light-sensitive layer. The light-sensitive material employing the thermal polymerization initiators is described in Japanese Patent Provisional Publication No. 61(1986)-260241.

The development stopping agents employable in the light-sensitive material are compounds that neutralize a base or react with a base to reduce the base concentration in the layer to thereby stop development, or compounds that mutually react with silver or a silver salt to suppress development. More specifically, examples of the development stopping agents include acid precursors capable of releasing acids upon heating electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with bases upon heating are described in Japanese Patent Provisional Publication No. 60(1985)-230134.

The antismudging agents employable in the light-sensitive material preferably are particles which are solid at ambient temperatures. Examples of the antismudging agents include starch particles described in U.K. Patent No. 1,232,347; polymer particles described in U.S. Pat. No. 3,625,736; microcapsule particles containing no color former described in U.K. Patent No. 1,235,991; and cellulose particles, and inorganic particles, such as particles of talc, kaolin, bentonite, agalmatolite, zinc oxide, titanium dioxide or aluminum oxide described in U.S. Pat. No. 2,711,375. Such particles preferably have a mean size of 3 to 50 $\mu$m, more preferably 5 to 40 $\mu$m. When the microcapsule is employed in the light-sensitive material, the size of said particle is preferably larger than that of the microcapsule.

Binders employable in the light-sensitive material preferably are transparent or semi-transparent hydrophilic binders. Examples of the binders include natural substances, such as gelatin, gelatin derivatives, cellulose derivatives, starch, and gum arabic; and synthetic polymeric substances, such as water-soluble polyvinyl compounds e.g., polyvinyl alcohol, polyvinylpyrrolidone, and acrylamide polymers. In addition to the synthetic polymeric substances, vinyl compounds dispersed in the form of latex, which are particularly effective to increase dimensional stability of photographic materials, can be also used. These binders can be used singly or in combination. The light-sensitive material employing a binder is described in Japanese Patent Provisional Publication No. 61(1986)-69062 (corresponding to U.S. Pat. No. 4,629,676 and European Patent Provisional Publication No. 0174634A2).

A photo polymerization initiator can be contained in the light-sensitive layer to polymerize the unpolymerized polymerizable compound after the image-formation.

In the case that the solvent of the polymerizable compound is used, the solvent is preferably contained in a microcapsule which is different from the microcapsule containing the polymerizable compound.

Examples and usage of the other optional components which can be contained in the light-sensitive layer are also described in the above-mentioned publications and applications concerning the light-sensitive material, and in Research Disclosure Vol. 170, No. 17029, pp. 9-15 (June 1978). The light-sensitive layer preferably has a pH value of not more than 7.

Examples of auxiliary layers which are optionally arranged on the light-sensitive material include an image-receiving layer, a heating layer, an antistatic layer, an anticurl layer, a release layer, a cover sheet or a protective layer, a layer containing a base or base precursor and a base barrier layer.

Instead of the use of the image-receiving material, the image-receiving layer can be arranged on the light-sensitive material to produce the desired image on the image-receiving layer of the light-sensitive material. The image-receiving layer of the light-sensitive material can be constructed in the same manner as the layer of the image-receiving material.

The light-sensitive material can be prepared, for instance, by the following process.

The light-sensitive material is usually prepared by dissolving, emulsifying or dispersing each of the components of the light-sensitive layer in an adequate medium to obtain coating solution, and then coating the obtained coating solution on a support.

The coating solution can be prepared by mixing liquid compositions each containing a component of the light-sensitive layer. Liquid composition containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

Preparations of liquid compositions and coating solutions of the components contained in the light-sensitive layer are described hereinbelow.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. In order to accelerate grain growth, the concentrations or amounts or the silver salt and halogen salt to be added or the rate of their addition can be increased as described in Japanese Patent Provisional Publication Nos. 55(1980)-142329 and 55(1980)-158124, and U.S. Pat. No. 3,650,757, etc.

The silver halide emulsion may be of a surface latent image type that forms a latent image predominantly on the surface of silver halide grains, or of an inner latent image type that forms a latent image predominantly in the interior of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Publication No. 58(1983)-3534 and Japanese Patent Provisional Publication No. 57(1982)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsions, hydrophilic colloids are advantageously used as protective colloids. Examples of usable hydrophilic colloids include proteins, e.g., gelatin, gelatin derivatives, gelatin grafted with other polymers, albumin, and casein; cellulose derivatives, e.g., hydroxyethyl cellulose, carboxymethyl cellulose, cellulose sulfate, etc.; saccharide derivatives, e.g., sodium alginate and starch derivatives; and a wide variety of synthetic hydrophilic polymers, such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole, and copolymers comprising monomers constituting these homopolymers. Among them, gelatin is most preferred. Examples of employable gelatins include not only lime-processed gelatin, but also acid-processed gelatin and enzyme-processed gelatin. Hydrolysis products or enzymatic decomposition products of gelatin can also be used.

In the formation of silver halide grains in the silver halide emulsion, ammonia, an organic thioether derivative as described in Japanese Patent Publication No. 47(1972)-11386 or sulfur-containing compound as described in Japanese Patent Provisional Publication No. 53(1978)-144319 can be used as a silver halide solvent. Further, in the grain formation or physical ripening, a cadmium salt, a zinc salt, a lead salt, a thallium salt, or the like can be introduced into the reaction system. Furthermore, for the purpose of overcoming high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of the conventional light-sensitive materials.

When the sensitizing dyes are added to the silver halide emulsion, the sensitizing dye is preferably added during the preparation of the emulsion. When the organic silver salts are introduced in the light-sensitive microcapsule, the emulsion of the organic silver salts can be prepared in the same manner as in the preparation of the silver halide emulsion.

In the preparation of the light-sensitive material, the polymerizable compound (the term, "polymerizable compound" includes the photo polymerizable composition and photo polymerizable compound) is used as the medium for preparation of the liquid composition containing another component of the light-sensitive layer. For example, the silver halide, (including the silver halide emulsion), the reducing agent, the photo polymerization initiator or the color image forming substance can be dissolved, emulsified or dispersed in the polymerizable compound to prepare the light-sensitive material. Especially, the color image forming substance is preferably incorporated into the polymerizable compound. Further, the necessary components for preparation of a microcapsule, such as shell material can be incorporated into the polymerizable compound.

The light-sensitive composition which is the polymerizable compound containing the silver halide can be prepared using the silver halide emulsion. The light-sensitive composition can be also prepared using silver halide powders which can be prepared by lyophilization. These light-sensitive composition can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups, —OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of keeping thus dispered state. Further, the polymer has another function of gathering silver halide along the interface between the polymerizable compound (i.e., light-sensitive composition) and the aqueous medium in preparation of the microcapsule. Therefore, using this polymer, silver halide can be easily introduced into the shell material of the microcapsule.

The light-sensitive composition can be also prepared by dispersing microcapsule containing silver halide emulsion as a core structure in the polymerizable compound instead of employing the above polymer.

The polymerizable compound (including the light-sensitive composition) is preferably emulsified in an aqueous medium to prepare the coating solution. The necessary components for preparation of the microcapsule, such as shell material can be incorporated into the emulsion. Further, other components such as the reducing agent can be added to the emulsion. The emulsion of the polymerizable compound can be processed for forming shell of the microcapsule.

When the emulsion of the polymerizable compound (including the dispersion of the microcapsule) contains silver halide or the compund is a photo polymerizable compound, the emulsion can be used as the coating solution of the light-sensitive material. The coating solution can be also prepared by mixing the emulsion of the polymerizable compound with the silver halide emulsion, the photo polymerization initiator, or other components such as organic silver salt. The other components can be added during the stage of the preparation of the coating solution in a similar manner as the above emulsion.

The light-sensitive material of the invention can be prepared by coating and drying the above-prepared coating solution on a supprot. The process for coating the coating solution on a support can be easily carried out in the conventional manner.

An image-forming method employing the light-sensitive material is described below.

The light-sensitive material of the invention is image-wise exposed with light to form a polymer image on the light-sensitive material.

Various exposure means can be employed in the image-wise exposure, and in general, the latent image on the silver halide is obtained by imagewise exposure to radiation including visible light. The type of light source and exposure can be selected depending on the light-sensitive wavelengths (sensitized wavelength when sensitization is carried out) or sensitivity of silver halide. Original image can be either monochromatic image or color image. In the case that the photo polymerizable composition or photo polymerizable compound is used, the polymerizable compound within the exposed area is polymerized.

In the case that the light-sensitive layer contains silver halide, a reducing agent and a polymerizable compound, development of the light-sensitive material can be conducted simultaneously with or after the image exposure. The development can be conducted using a developing solution in the same manner as the image forming method described in Japanese Patent Publication No. 45(1970)-11149. The image forming method described in Japanese Patent Provisional Publication No. 61(1986)-69062 which employs a heat development process has an advantage of simple procedures and short processing time because of the dry process. Thus, the latter method is preferred as the development process of the light-sensitive material.

Heating in the heat-development process can be conducted in various known manners. The heating layer which is arranged on the light-sensitive material can be used as the heating means in the same manner as the light-sensitive material described in Japanese Patent Provisional Publication No. 61(1986)-294434. The light-sensitive material is preferably heated while suppressing supply of oxygen into the light-sensitive layer from outside. Heating temperatures for the development process usually ranges from 80° C. to 200° C., and preferably from 100° C. to 160° C. Various heating patterns are applicable. The heating time is usually not shorter than 1 second, preferably from 1 second to 5 minutes, and more preferably from 1 second to 1 minute.

During the above development process, a polymerizable compound within the area where a latent image of the silver halide has been formed or within the area where a latent image of the silver halide has not been formed is polymerized. In a general system, the polymerizable compound within the area where the latent image has been formed is polymerized. If a nature or amount of the reducing agent is controlled, the polymerizable compound within the area where the latent image has not been formed can be polymerized.

A polymer image can be formed on the light-sensitive layer in the above process. A color image can be obtained by fixing a dye or pigment on a polymer image.

Further, a color image can be formed on the light-sensitive material in which the light-sensitive layer contains a color former and a developer, one of them is together with the polymerizable compound contained in a microcapsule, and the other is arranged outside of the microcapsule.

In the image forming method employing the light-sensitive material, the image is preferably formed on an image-receiving material. The image-receiving material is described hereinbelow.

Examples of the material employable as the support of the image-receiving material include glass, paper, fine paper, coat paper, cast-coated paper, baryta paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene). In the case that a porous material, such as paper is employed as the support of the image-receiving material, the porous support preferably has such a surface characteristic that a filtered maximum waviness of not less than 4 $\mu$m is observed in not more than 20 positions among 100 positions which are determined at random on a filtered waviness curve obtained according to JIS-B-0610. Further, a transparent material can be employed as the support of the image-receiving material to obtain a transparent or a projected image.

The image-receiving material is usually prepared by providing an image-receiving layer on the support. The image-receiving layer can be constructed according to the color formation system. In the cases that a polymer image is formed on the image-receiving material and that a dye or pigment is employed as the color image forming substance, the image-receiving material can be composed of a simple support.

For example, when a color formation system using a color former and developer is employed, the developer can be contained in the image-receiving layer. Further, the image-receiving layer can be composed of at least one layer containing a mordant. The mordant can be selected from the compounds known in the art of the conventional photography according to the kind of the color image forming substance. If desired, the image-receiving layer can be composed of two or more layers containing two or more mordants different in the mordanting power from each other.

The image-receiving layer preferably contains a polymer as binder. The binder which may be employed in the above-mentioned light-receiving layer is also employable in the image-receiving layer. Further, a polymer having a transmission coefficient of oxygen of not more than $1.0 \times 10^{-11}$ cm$^3$·cm/cm$^2$·sec·cmHg can be used as the binder to protect the color of the image formed on the image-receiving material.

The image-receiving layer can contain a granulated thermoplastic compound to obtain a glossy image. Further, the image-receiving layer can contain a white pigment (e.g., titanium dioxide) to function as a white reflection layer. Furthermore, a photo polymerization initiator or a thermalpolymerization initiator can be contained in the image-receiving layer to polymerize the unpolymerized polymerizable compound.

The image-receiving layer can be composed of two or more layers according to the above-mentioned functions. The thickness of the image-receiving layer preferably ranges from 1 to 100 μm, more preferably from 1 to 20 μm.

A protective layer can be provided on the surface of the image-receiving layer. A layer containing a granulated thermoplastic compound can be also provided on the image-receiving layer.

After the image exposure and/or the development process, pressing the light-sensitive material on the image-receiving material to transfer the unpolymerized polymerizable compound to the image-receiving material, a polymer image can be obtained in the image-receiving material. The process for pressing can be carried out in various known manners.

In the case that the light-sensitive layer contains a color image forming substance, the color image forming substance is fixed by polymerization of the polymerizable compound. Then, pressing the light-sensitive material on the image-receiving material to transfer the color image forming substance in unfixed portion, a color image can be produced on the image-receiving material.

After the image is formed on the image-receiving material, the image-receiving material can be heated to polymerize the transferred unpolymerized polymerizable compound. By the above-mentioned process, the obtained image can be improved in the preservability.

Various image recording apparatus can be used for the image-forming method. An example of the apparatus comprises an exposure device for imagewize exposing the light-sensitive material to form a latent image, a heat development device for fixing the area corresponding to the latent image, a transfer device for pressing the developed light-sensitive material on the image-receiving material. Another example of the apparatus comprises an fixing apparatus for irradiating, pressing or heating the image-receiving material on which an image has been transferred in addition to the above-mentioned devices.

The light-sensitive material can be used for monochromatic or color photography, printing, radiography, diagnosis (e.g., CRT photography of diagnostic device using supersonic wave), copy (e.g., computer-graphic hard copy), etc.

The present invention is further described by the following examples without limiting the invention.

EXAMPLE 1

Preparation of Paper Support

In a Jordan type conical refiner, 10 weight parts of a laubholz bleached sulfite pulp (LBSP) and 90 weight parts of a laubholz bleached kraft pulp (LBKP) were beaten to give a pulp having Canadian standard freeness of 280 cc. To the obtained pulp were added 1.0 weight part of rosin, 2.0 weight parts of aluminum sulfate and 0.5 weight part of polyamide-polyamine-epichlorohydrin to obtain a paper stuff, in which the part was a dry weight ratio to one part of the pulp. A paper having a basis weight of 80 g/m² was made fromt the paper stuff using a Fourdrinier paper machine.

The obtained paper was calendered at a linear pressure of 240 kgf/cm and a temperature of 70° C. in a machine calender to obtain a base paper sheet having a void volume of 29% and the density of 1.03 g/cm³.

On the surface of the base paper sheet was coated a mixture of 300 weight parts of clay and 100 weight parts of SBR (i.e., styrene-butadiene rubber) latex in the coating amount of 10 g/m².

Preparation of Silver Halide Emulsion

In 1,000 ml of water were dissolved 20 g of gelatin and 3 g of sodium chloride, and the resulting gelatin solution was kept at 75° C. To the gelatin solution, 600 ml of an aqueous solution containing 21 g of sodium chloride and 56 g of potassium bromide and 600 ml of an aqueous solution containing 0.59 mole of silver nitrate were added simultaneously at the same feed rate over a period of 40 minutes to obtain a silver chlorobromide emulsion having cubic grains, uniform grain size distribution, the mean grain size of 0.35 μm and the bromide content of 80 mole %.

The emulsion was washed for desalting and then subjected to chemical sensitization with 5 mg of sodium thiosulfate and 20 mg of 4-hydroxy-6-methyl-1,3,3a,7-tetrazaindene at 60° C. Yield of the emulsion was 600 g.

Preparation of Silver Benzotriazole Emulsion

In 3,000 ml of water were dissolved 28 g of gelatin and 13.2 g of benzotriazole, and the solution was kept at 40° C. while stirring. To the solution was added 100 ml of an aqueous solution of 17 g of silver nitrate over 2 min. Excessive salts were sedimented and removed from the resulting emulsion by pH-adjustment. Thereafter, the emulsion was adjusted to pH 6.30 to obtain a silver benzotriazole emulsion. The yield of the emulsion was 400 g.

Preparation of Light-Sensitive Composition

In 100 g of trimethylolpropane triacrylate were dissolved 0.40 g of the following copolymer, 6.00 g of Pargascript Red I-6-B (tradename of Ciba-Geigy) and 2 g of Emulex NP-8 (tradename of Nippon Emulsion Co., Ltd.).

(Copolymer)

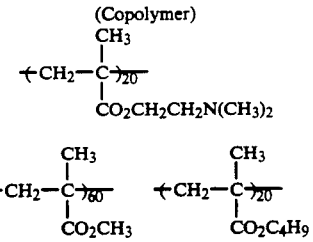

In 18.00 g of the solution was dissolved 0.002 g of the following thiol derivative.

(Thiol derivative)

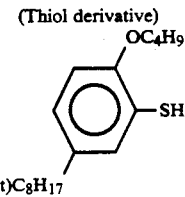

To the resulting solution was added a solution in which 0.16 g of the following reducing agent (I) and 1.22 g of the following reducing agent (II) are dissolved in 1.80 g of methylene chloride.

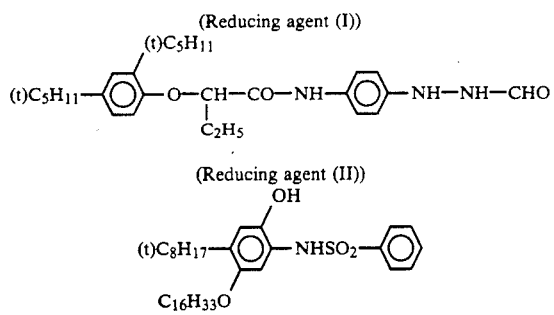

To the resulting solution were added 3.50 g of the silver halide emulsion and 3.35 g of the silver benzotriazole emulsion, and the mixture was stirred at 15,000 r.p.m. for 5 minutes to obtain a light-sensitive composition.

Preparation of Light-Sensitive Microcapsule

To 10.51 g of 18.6% aqueous solution of Isobam (tradename of Kuraray Co., Ltd.) was added 48.56 g of 2.89% aqueous solution of pectin. After the solution was adjusted to a pH of 4.0 using 10% sulfuric acid, the light-sensitive composition was added to the resulting solution, and the mixture was stirred at 7,000 r.p.m. for 2 minutes to emulsify the light-sensitive composition in the aqueous medium.

To 72.5 g of the aqueous emulsion were added 8.32 g of 40% aqueous solution of urea, 2.82 g of 11.3% aqueous solution of resorcinol, 8.56 g of 37% aqueous solution of formaldehyde and 3.00 g of 8.00% aqueous solution of ammonium sulfate in order, and the mixture was heated at 60° C. for 2 hours while stirring. After the mixture was adjusted to a pH of 7.3 using 10% aqueous solution of sodium hydroxide, 3.62 g of 30.9% aqueous solution of sodium hydrogen sulfite was added to the mixture to obtain a dispersion containing light-sensitive microcapsules.

Preparation of Light-Sensitive Material

To 10.0 g of the light-sensitive microcapsule dispersion were added 1.0 g of 1% aqueous solution of the following anionic surfactant and 5 g of 10% aqueous solution (solvent: water/ethanol=50/50 as volume ratio) of guanidine trichloroacetate to prepare a coating solution.

The coating solution was uniformly coated on the coating layer of the paper support (a) using a coating rod of #40 in an coating amount of 70 cc/m² and dried at 40° C. to obtain a light-sensitive material (A).

(Anionic surfactant)

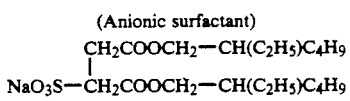

EXAMPLE 2

Preparation of Paper Support

Paper supports (b) to (d) were prepared in the same manner as in Example 1, except that the conditions of the calender (i.e., linear pressure and temperature) were changed as indicated in Table 1. The void volume and the density of the paper supports are also shown in Table 1. In the preparation of the base paper sheet, the paper support (d) was partially blackened (burned).

Preparation of Light-Sensitive Material

Light-sensitive materials (B) to (D) were prepared in the same manner as in Example 1, except that the paper supports (b) to (d) were respectively used.

COMPARISON EXAMPLE 1

Preparation of Paper Support

A paper support (x) was prepared in the same manner as in Example 1, except that the base paper sheet was not calendered. The void volume and the density of the paper support (x) are shown in Table 1.

Preparation of Light-Sensitive Material

A light-sensitive material (X) was prepared in the same manner as in Example 1, except that the paper support (x) was used.

COMPARISON EXAMPLE 2

Preparation of Paper Support

A paper support (y) was prepared in the same manner as in Example 1, except that the conditions of the calender (i.e., linear pressure and temperature) were changed as indicated in Table 1. The void volume and the density of the paper support (y) are shown in Table 1.

Preparation of the Light-Sensitive Material

A light-sensitive material (Y) was prepared in the same manner as in Example 1, except that the paper support (y) was used.

TABLE 1

| Paper Support | Machine Calendar Linear Pressure (kgf/cm) | Temperature | Void Volume (%) | Density (g/cm³) |
|---|---|---|---|---|
| (a) | 280 | 70° C. | 29 | 1.03 |
| (b) | 240 | 70° C. | 31 | 1.00 |
| (c) | 180 | 70° C. | 36 | 0.92 |
| (d) | 350 | 70° C. | 17 | 1.24 |
| (x) | — | — | 56 | 0.65 |
| (y) | 120 | 30° C. | 49 | 0.73 |

EXAMPLE 3

Preparation of Light-Sensitive Material

To a momoner mixture of 2 g of trimethylolpropane triacrylate and 7 g of methylmethacrylate was added 0.7 g of 2-mercapto-5-methylthio-1,3,4-thiadiazole, and the resulting mixture was dispersed using ultrasonic wave hollander to obtain a solution. In the solution were dissolved 6 g of methylene chloride, 0.7 g of 4,4'-bis(diethylamino)benzophenone, 2,1 g of 2,2'-bis(o-chlorophenyl)-4,4',5,5'-tetraphenylimidazole and 2.1 g of 3-diethylamino-6-chloro-7-anilinofluorane to obtain an oil phase.

A mixture of 17.0 g of 10% aqueous solution of arabic gum, 18.8 g of 12% aqueous solution of isobutylene/maleic anhydride and 26.8 g of distilled water was adjusted to pH 3.5 using sulfric acid. To the mixture were added 4.6 g of urea and 0.6 g of resorcin, and in the resulting solution was emulsified and dispersed the oil phase. The average particle diameter of the oil droplets was 3 μm. To the mixture was added 12.9 g of 36% formaldehyde, and the mixture was heated at 60° C. while stirring. After 1 hour, to the mixture was added 9.0 g of 5% aqueous solution of ammonium sulfate, and the mixture was kept at 60° C. while stirring for 1 hour. The resulting mixture was cooled and then adjusted to pH 7.0 using an aqueous solution of sodium hydroxide to obtain a microcapsule dispersion.

To 5 g of the microcapsule dispersion were added 1.53 g of 15% aqueous solution of polyvinyl alcohol, 3.47 g of distilled water and 0.57 g of starch to obtain a coating solution. The coating solution was coated on the surface of the paper support (a) on which the coating layer was provided using a coating rod #10 in an coating amount of 18 cc/m$^2$ and dried at 40° C. to obtain a light-sensitive material (E).

Preparation of Image-Receiving Material

To 125 g of water was added 11 g of 40% aqueous solution of sodium hexametaphosphate, and were further added 34 g of zinc 3,5-di-α-methylbenzylsalicylate and 82 g of 55% slurry of calcium carbonate, followed by coarsely dispersing in a mixer. The coarse dispersion was then finely dispersed in Dynomill dispersing device. To 200 g of the resulting dispersion were added 6 g of 50% latex of SBR (styrene-butadiene rubber) and 55 g of 8% aqueous solution of polyvinyl alcohol, and the resulting mixture was made uniform.

The mixture was then uniformly coated on a cast-coated paper to give a layer having a wet thickness of 30 μm and dried to obtain an image-receiving material.

Evaluation of Light-Sensitive Material

Each of the light-sensitive materials prepared in Examples 1 & 2 and Comparison Examples 1 & 2 was exposed to light using a tungsten lamp at 60 lux for 1 second, and then heated on a hot plate at 125° C. for 40 seconds. Each of the exposed and heated light-sensitive materials was then combined with the image-receiving material and passed through press rolls under pressure of 250 kg/cm$^2$ or 700 kg/cm$^2$ to obtain a magenta positive image on the image-receiving material.

The light-sensitive material (E) prepared in Example 3 was exposed to light using high pressure mercury lamp at 400 W for 1 second from a distance of 50 cm. The exposed exposed light-sensitive material was then combined with the image-receiving material and passed through press rollers at pressure of 250 kg/m$^2$ or 700 kg/cm$^2$ to obtain a magenta possitive image on the image-receiving material.

The number of the low optical densitiy spots on the obtained image was visually observed.

The results obtained in Example 1 to 3 and Comparison Examples 1 & 2 are shown in Table 2. In Table 2, each of the values represents number of the low optical density spots having a diameter of not less than 1 mm observed within the circular area having a diameter of 4 cm in the color image.

TABLE 2

| Light-Sensitive Material | Paper Support | Base Paper Sheet | | Number of low optical density spots (Pressure (kg/cm$^2$)) | |
|---|---|---|---|---|---|
| | | Void Volume | Density | 250 | 700 |
| (A) | (a) | 29% | 1.03 | <20 | <20 |
| (B) | (b) | 31% | 1.00 | 50-100 | 20-50 |
| (C) | (c) | 36% | 0.92 | 100-150 | 50-100 |
| (D) | (d) | 17% | 1.24 | <20 | <20 |
| (X) | (x) | 56% | 0.65 | ≧300 | ≧300 |
| (Y) | (y) | 49% | 0.73 | ≧300 | ≧300 |
| (E) | (a) | 29% | 1.03 | <20 | <20 |

It is apparent from the results in Table 2 that each of the light-sensitive materials (A), (B), (C), (D) and (E) is remarkably reduced in the occurrence of the low optical density spots.

We claim:

1. A light-sensitive material comprising a light-sensitive layer containing silver halide, a reducing agent and an ethylenic unsaturated polymerizable compound provided on a paper support, said silver halide and polymerizable compound being contained in microcapsules which are dispersed in the light-sensitive layer, wherein the paper support employs a base paper sheet having a void volume of 20 to 40%, wherein the base paper sheet contains at least one pulp selected from the group consisting of a laubholz bleached sulfite pulp and a laubholz dissolving pulp in an amount of 5 to 60 weight % based on the total amount of pulp contained in the base paper sheet.

2. The light-sensitive material as claimed in claim 1, wherein the base paper sheet has a density of not higher than 1.2 g/cm$^3$.

3. The light-sensitive material as claimed in claim 1, wherein the base paper has a density of 0.8 to 1.2 g/cm$^3$.

4. The light-sensitive material as claimed in claim 1, wherein the base paper sheet is a paper which has been calendered at a linear pressure of 150 to 300 kgf/cm.

5. The light-sensitive material as claimed in claim 1, wherein the base paper sheet is a paper which has been calendered at a linear pressure of 150 to 300 kgf/cm at a temperature in the range of 50° to 90° C.

6. The light-sensitive material as claimed in claim 1, wherein the base paper sheet contains pulp which has a Canadian standard freeness of 200 to 400 cc as a whole.

7. The light-sensitive material as claimed in claim 1, wherein the paper support comprises a coating layer containing a hydrophobic polymer provided on a side or both sides of the base paper sheet.

8. The light-sensitive material as claimed in claim 1, wherein the light-sensitive layer contains a color image forming substance, said color image forming substance being contained in the microcapsules.

9. A light-sensitive material comprising a light-sensitive layer containing a photo polymerizable composition or a photo polymerizable compound provided on a paper support, said photo polymerizable composition or photo polymerizable compound being contained in microcapsules which are dispersed in the light-sensitive layer, wherein the paper support employs a base paper sheet having a void volume of 20 to 40%, wherein the base paper sheet contains at least one pulp selected from the group consisting of a laubholz bleached sulfite pulp and a laubholz dissolving pulp in an amount of 5 to 60 weight % based on the total amount of pulp contained in the base paper sheet.

10. The light-sensitive material as claimed in claim 9, wherein the base paper sheet has a density of not higher than 1.2 g/cm$^3$.

11. The light-sensitive material as claimed in claim 9, wherein the base paper has a density of 0.8 to 1.2 g/cm$^3$.

12. The light-sensitive material as claimed in claim 9, wherein the base paper sheet is a paper which has been calendered at a linear pressure of 150 to 300 kgf/cm at a temperature in the range of 50° to 90° C.

13. The light-sensitive material as claimed in claim 9, wherein the base paper sheet is a paper which has been calendered at a linear pressure of 150 to 300 kgf/cm.

14. The light-sensitive material as claimed in claim 9, wherein the base paper sheet contains pulp which has a Canadian standard freeness of 200 to 400 cc as a whole.

15. The light-sensitive material as claimed in claim 9, wherein the paper support comprises a coating layer containing a hydrophobic polymer provided on a side or both sides of the base paper sheet.

16. The light-sensitive material as claimed in claim 9, wherein the light-sensitive layer contains a color image forming substance, said color image forming substance being contained in the microcapsules.

* * * * *